United States Patent
Chen et al.

(10) Patent No.: US 8,810,701 B2
(45) Date of Patent: Aug. 19, 2014

(54) IMAGE SENSOR SYSTEM AND AMPLIFYING/DIGITIZING CIRCUIT THEROF FOR PROMOTING PERFORMANCE WHILE SAVING ON POWER CONSUMPTION AND REDUCING THE CIRCUIT AREA

(75) Inventors: Shih-Feng Chen, Grand Cayman (KY); Ping-Hung Yin, Grand Cayman (KY)

(73) Assignee: Himax Imaging, Inc., Grand Cayman (KY)

( * ) Notice: Subject to any disclaimer, the term of this patent is extended or adjusted under 35 U.S.C. 154(b) by 615 days.

(21) Appl. No.: 12/702,271

(22) Filed: Feb. 8, 2010

(65) Prior Publication Data

US 2011/0194004 A1    Aug. 11, 2011

(51) Int. Cl.
*H04N 5/335*    (2011.01)
*H04N 5/378*    (2011.01)
*H03M 1/12*    (2006.01)
*H03F 3/00*    (2006.01)
*H03M 1/56*    (2006.01)

(52) U.S. Cl.
CPC ............. *H03F 3/005* (2013.01); *H04N 5/378* (2013.01); *H03M 1/56* (2013.01); *H03M 1/1225* (2013.01); *H03F 2200/261* (2013.01)
USPC .......................................................... 348/300

(58) Field of Classification Search
USPC .......................................... 348/300; 330/110
See application file for complete search history.

(56) References Cited

U.S. PATENT DOCUMENTS

| | | | |
|---|---|---|---|
| 7,397,506 B2 | 7/2008 | Bell | |
| 2002/0027453 A1* | 3/2002 | Kulhalli et al. | 327/96 |
| 2004/0212704 A1* | 10/2004 | Bell et al. | 348/241 |
| 2009/0212827 A1 | 8/2009 | Keel | |
| 2009/0273500 A1 | 11/2009 | Krymski | |

FOREIGN PATENT DOCUMENTS

| | | |
|---|---|---|
| TW | 535427 | 6/2003 |
| TW | 550942 | 9/2003 |
| TW | 200402016 | 2/2004 |

* cited by examiner

*Primary Examiner* — Usman Khan
(74) *Attorney, Agent, or Firm* — Winston Hsu; Scott Margo

(57) ABSTRACT

An amplifying/digitizing circuit with a signal amplifying capability and a comparator capability is provided. The amplifying/digitizing circuit includes an amplifier having an input end and an output end, and a control circuit. The control circuit is coupled to the input end and the output end of the amplifier. When the amplifying/digitizing circuit is operated under an amplifying mode, the control circuit has a first configuration to receive a first input signal and makes the amplifier generate an output voltage at the output end according to the first input signal and an amplification factor. When the amplifying/digitizing circuit is operated under an ADC mode, the control circuit has a second configuration to receive a second input signal and makes the amplifier generate a comparison result according to the second input signal and the output voltage.

15 Claims, 8 Drawing Sheets

IMAGE SENSOR SYSTEM AND AMPLIFYING/DIGITIZING CIRCUIT THEROF FOR PROMOTING PERFORMANCE WHILE SAVING ON POWER CONSUMPTION AND REDUCING THE CIRCUIT AREA

BACKGROUND OF THE INVENTION

1. Field of the Invention

The present invention relates to an image sensor, and more particularly, to an image sensor and an amplifying/digitizing circuit thereof.

2. Description of the Prior Art

In an image system, an analog-to-digital converter (ADC) is indispensable for converting a sensed signal of an analog format into a digital format, and is broadly used in various applications, such as a CMOS Image Sensor (CIS) system. The ADCs can be divided into flash ADCs, ramp ADCs, pipelined ADCs, and successive approximation ADCs, etc. according to corresponding circuit structures.

Please refer to FIG. 1. FIG. 1 is a conventional image sensor system 100, which includes a sensor array 110, a column amplifier 120, an ADC 130, and an image processor 140. The signals from the sensor array 110 are first amplified by the column amplifiers 120 and then converted into digital form by the ADC 130. Conventionally, the image sensor system 100 may use a ramp ADC as the ADC 130.

Due to the existing ADC structures lack the amplification functionality, the conventional image sensor system 100 has to adopt an amplification circuit as the column amplifier 120 for improving the SNR and promoting the image quality of the image sensor system 100.

In order to minimize the chip area and enhance the performance, manufacturers are dedicated to design new circuits to achieve the goals.

SUMMARY OF THE INVENTION

It is therefore one of the objectives of the present invention to provide an amplifying/digitizing circuit by using a single operational amplifier, to promote performance while saving on power consumption and reducing the circuit area, and provide an image sensor system thereof.

According to an aspect of the present invention, an amplifying/digitizing circuit is provided. The amplifying/digitizing circuit includes an amplifier having an input end and an output end, and a control circuit. The control circuit is coupled to the input end and the output end of the amplifier. When the amplifying/digitizing circuit is operated under an amplifying mode, the control circuit has a first configuration to receive a first input signal and makes the amplifier generate an output voltage at the output end according to the first input signal and an amplification factor. When the amplifying/digitizing circuit is operated under an ADC mode, the control circuit has a second configuration to receive a second input signal and makes the amplifier generate a comparison result according to the second input signal and the output voltage.

According to another aspect of the present invention, an amplifying/digitizing circuit is provided. The amplifying/digitizing circuit includes an amplifier having an input end and an output end, a first capacitor, a second capacitor, a first switch, a second switch, a third switch, and a fourth switch. The first capacitor has a first node coupled to the first input signal, and a second node coupled to the input end of the amplifier. The second capacitor has a first node coupled to the input end of the amplifier, and a second node. The first switch is coupled between the second node of the first capacitor and the input end of the amplifier; the second switch is coupled between the input end of the amplifier and the output end of the amplifier; the third switch is coupled between the output end of the amplifier and the second node of the second capacitor; and the fourth switch is coupled between the second node of the second capacitor and the second input signal.

According to yet another aspect of the present invention, an image sensor system is provided. The image sensor system includes a sensor array and an amplifying/digitalizing circuit, wherein the sensor array senses photons to output an electrical signal and the amplifying/digitalizing circuit amplifies and digitalizes the electronic signal to output a digital signal. The amplifying/digitalizing circuit includes an amplifier, a first capacitor, a second capacitor, a first switch, and a second switch. Wherein the amplifier has an input end and an output end; the first capacitor has a first node and a second node which is connected to the input end of the amplifier; the first switch selectively connects the electrical signal from the sensor to the input end of the amplifier; and the second switch connects the second node of the second capacitor selectively to the output end of the amplifier or a ramp voltage.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." The terms "couple" and "couples" are intended to mean either an indirect or a direct electrical connection. Thus, if a first device couples to a second device, that connection may be through a direct electrical connection, or through an indirect electrical connection via other devices and connections.

One embodiment of the present invention provides an amplifying/digitizing circuit which uses a single operational amplifier to achieve an amplification function and an analog-to-digital conversion function, and an image sensor system adopts the amplifying/digitizing circuit therein. By controlling the on/off states of the switches implemented in the proposed amplifying/digitizing circuit of the present invention, the exemplary amplifying/digitizing circuit can execute the amplification function and the analog-to-digital function respectively under an amplifying mode and an ADC mode. By applying the amplifying/digitizing circuit disclosed here, low power consumption and compact chip area can be realized.

Figure 1:
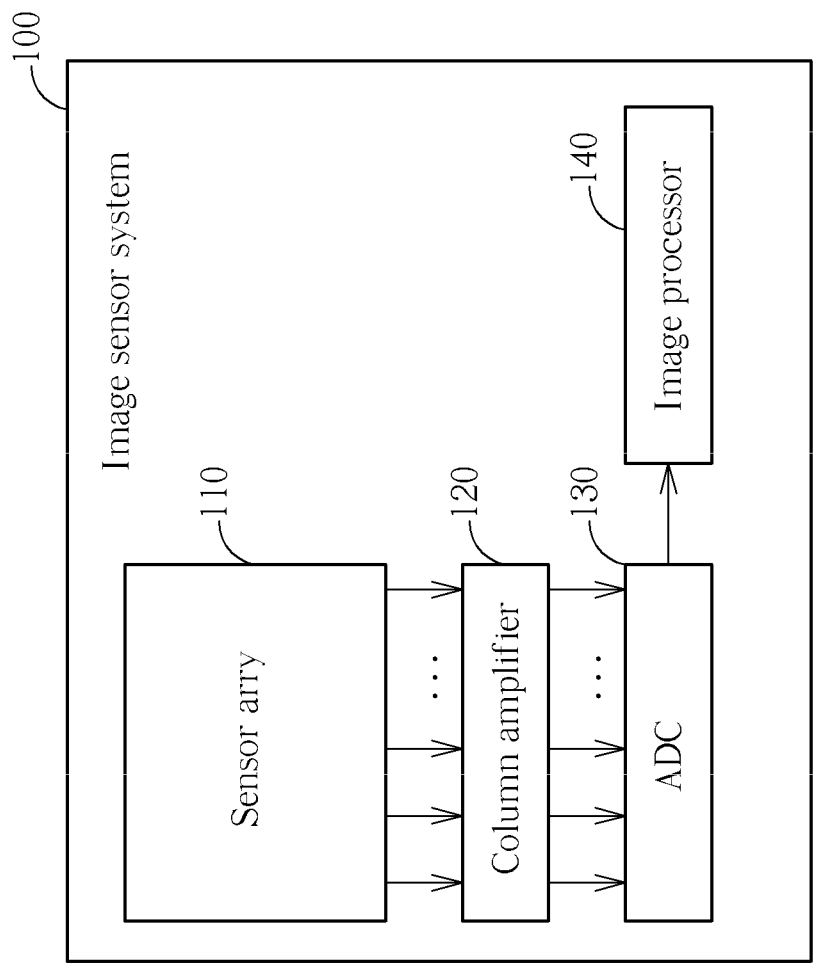
FIG. 1 is a block diagram illustrating a conventional image sensor system.
Figure 2:
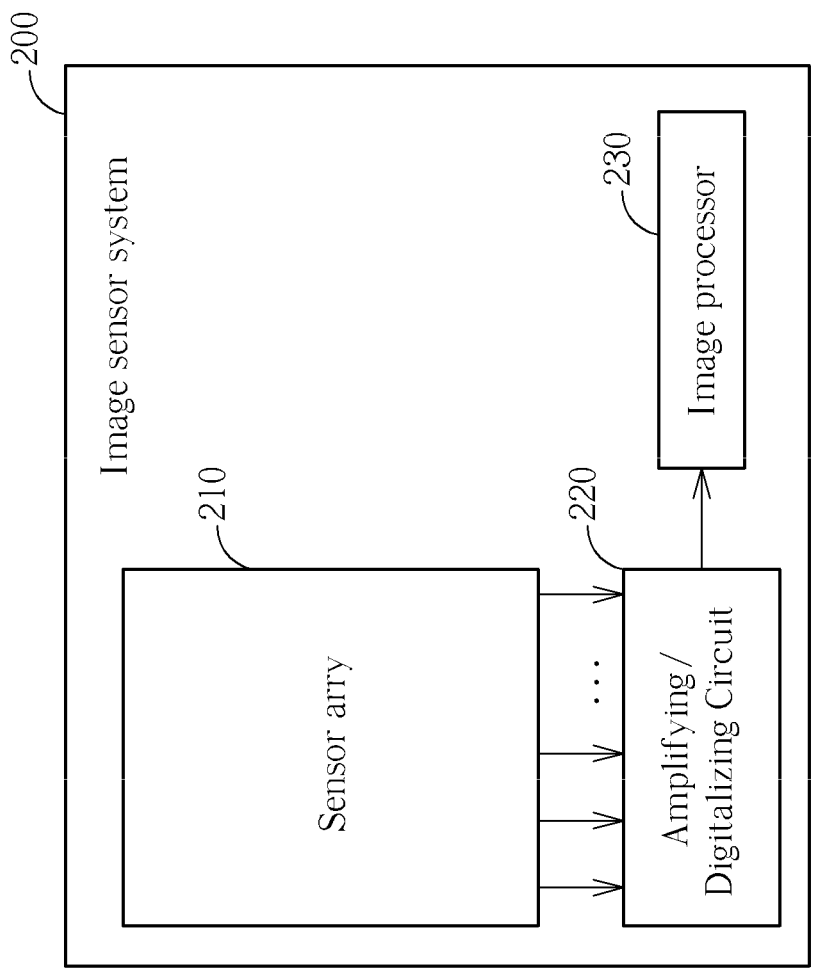
FIG. 2 is a block diagram illustrating an exemplary embodiment of an image sensor system of the present invention.

Please refer to FIG. 2. FIG. 2 is a block diagram illustrating an exemplary embodiment of an image sensor system 200 of the present invention. In FIG. 2, the image sensor system 200 includes a sensor array 210 for sensing photons and generating an electrical signal accordingly; an amplifying/digitalizing circuit 220 for amplifying the magnitude of the electrical signal and then digitalizing the amplified electrical signal to generate a digital signal; and an image processor 230, for processing the digital signal to generate output data. Since the operations of sensor arrays and image processors are well known by people skilled in this art, further descriptions of the sensor array 210 and image processor 230 are omitted here for the sake of brevity. In one example, the amplifying/digitalizing circuit 220 uses an amplifier for the amplifying function, and uses the amplifier and a counter as a ramp ADC structure to execute the analog-to-digital conversion function.

Figure 3:
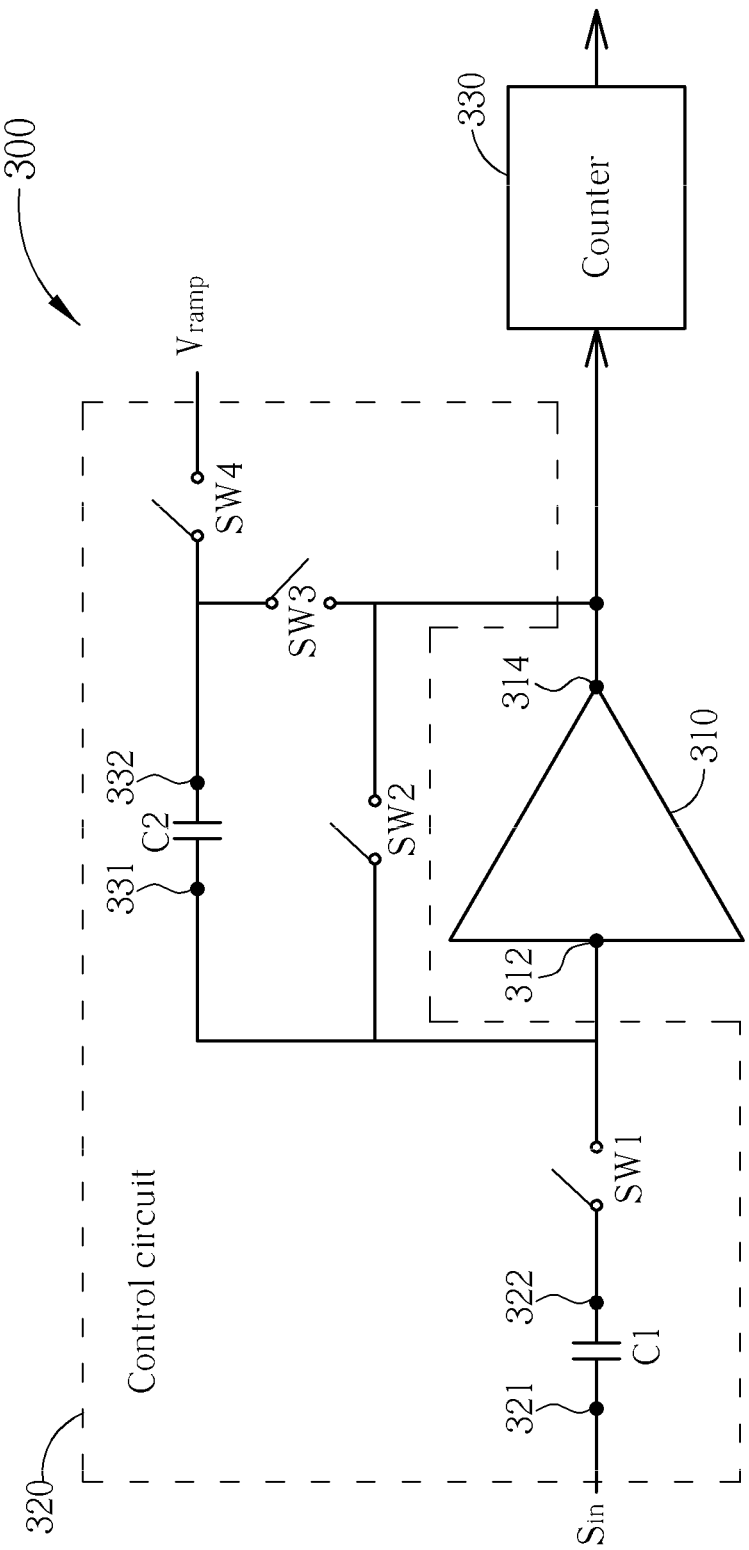
FIG. 3 is a block diagram illustrating an exemplary embodiment of an amplifying/digitizing circuit of the present invention.

Please refer to FIG. 3 in conjunction with FIG. 2. FIG. 3 is a block diagram illustrating an exemplary embodiment of an amplifying/digitizing circuit (e.g., the amplifying/digitalizing circuit 220 in FIG. 2) of the present invention. In FIG. 3, the exemplary amplifying/digitizing circuit 300 includes an amplifier 310, a control circuit 320 and a counter 330. The amplifying/digitizing circuit 300 can be operated under a reset mode, an amplifying mode or an ADC mode, controlled by the control circuit 320. In this way, the amplifier 310 may be for example an operational amplifier to amplify the sensed signal generated from the sensor array 210 under the amplifying mode, and then execute the comparing operation under the ADC mode.

In this exemplary embodiment, the control circuit 320 includes, but is not limited to, a first capacitor C1, a second capacitor C2, a first switch SW1, a second switch SW2, a third switch SW3, and a fourth switch SW4. The first capacitor C1 has a first node 321 and a second node 322 where the first node 321 is coupled to a first input signal $S_{in}$, and the second node 322 is coupled to an input end 312 of the amplifier 310 via the first switch SW1. The second capacitor C2 has a first node 331 and a second node 332, where the first node 331 of the second capacitor C2 is coupled to the input end 312 of the amplifier 310. The first switch SW1 is coupled between the second node 322 of the first capacitor C1 and the input end 312 of the amplifier 310. The second switch SW2 is coupled between the input end 312 and the output end 314 of the amplifier 310. The third switch SW3 is coupled between the output end 314 of the amplifier 310 and the second node 332 of the second capacitor C2. The fourth switch SW4 is coupled between the second node 332 of the second capacitor C2 and a second input signal $V_{ramp}$.

Each time before the amplifying/digitizing circuit 300 starts processing the first input signal $S_{in}$, the amplifying/digitizing circuit 300 enters the reset mode for resetting the amplifier 310 and/or the first capacitor C1 and the second capacitor C2. As is well known to people skilled in this art, the sensed signals at one row are processed at a time, and here the amplifying/digitizing circuit 300 can serve as part of a ramp ADC. For each signal processing cycle, the exemplary amplifying/digitizing circuit 300 is configured to operate under three different modes in the following order: reset mode, amplifying mode, and ADC mode. However, with appropriate adjustments, the amplifying/digitizing circuit 300 can be applied in other ADC structures to dynamically provide the amplification capability as well as the ADC capability as needed; these alternative designs obey and fall within the scope of the present invention.

In detail, the amplifying/digitizing circuit 300 enters the reset mode when it is powered on and/or before starting processing of a sensed signal of a row. Next, amplifying/digitizing circuit 300 enters the amplifying mode to amplify the first input signal $S_{in}$ received from the first node 321 of the first capacitor C1 according to an amplification factor to promote the SNR of the sensed signal. Then, the amplifying/digitizing circuit 300 enters the ADC mode to digitize the amplified sensed signal.

Under the ADC mode, the amplifier 310 of the amplifying/digitizing circuit 300 serves as a comparator, and receives a ramp voltage (i.e., the second input signal $V_{ramp}$) via the fourth switch SW4. The detailed descriptions are disclosed in the following paragraphs.

Figure 4:
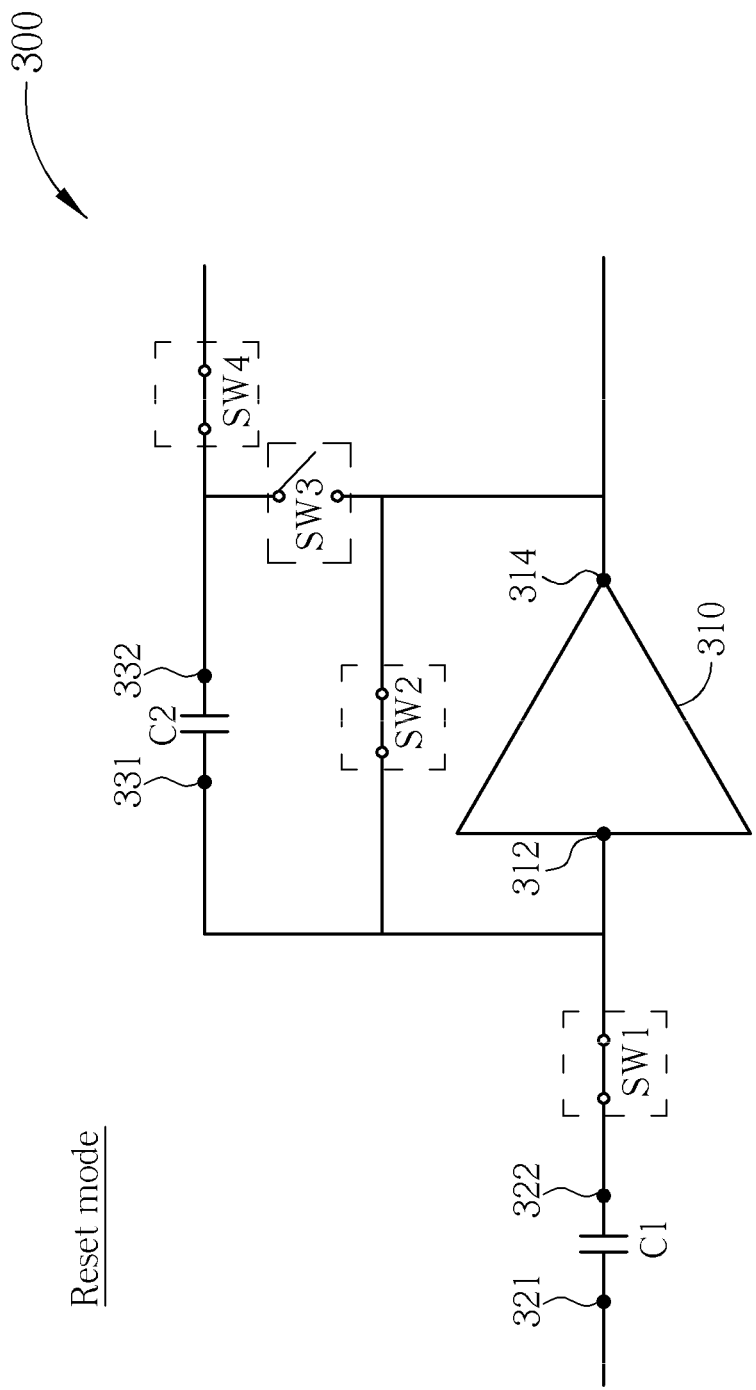
FIG. 4 is a diagram illustrating an exemplary embodiment of the configuration of the amplifying/digitizing circuit under the reset mode.

Please refer to FIG. 4 in conjunction with FIG. 2~3. FIG. 4 is a diagram illustrating an exemplary embodiment of a configuration of the amplifying/digitizing circuit 300 under the reset mode. In the reset mode, the control circuit 310 has a first configuration that the first switch SW1, the second switch SW2, and the fourth switch SW4 are switched on and the third switch SW3 is switched off so as to reset the amplifier 310 and the capacitors C1 and C2. For illustrative purposes, in the following descriptions, the amplifier 310 is a single-ended amplifier. However, the aforementioned exemplary design is for illustrative purposes only. Actually, under different design requirements, the amplifier 310 can be implemented using a differential amplifier. Furthermore, provided that substantially the same result is obtained, the control circuit 310 may have other circuit structures obeying the spirit of the present invention to provide different configurations corresponding to the reset mode, amplifying mode and the ADC mode, respectively. These alternative designs still fall within the scope of the present invention.

Figure 5:
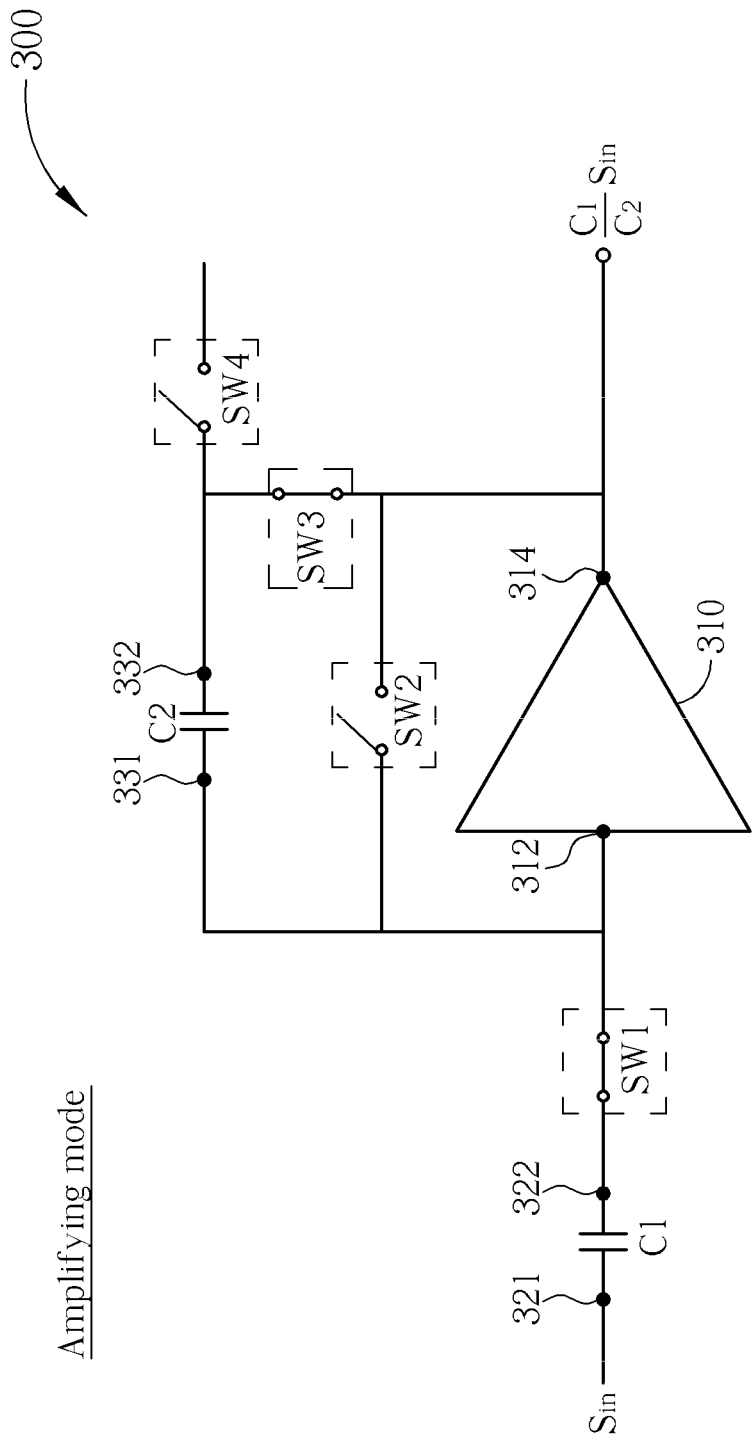
FIG. 5 is a diagram illustrating an exemplary embodiment of the configuration of the amplifying/digitizing circuit under the amplifying mode.

After the reset operation is completed, the amplifying/digitizing circuit 300 enters the amplifying mode for amplifying a sensed signal. Please refer to FIG. 5 in conjunction with FIG. 2~4. FIG. 5 is a diagram illustrating an exemplary embodiment of the configuration of the amplifying/digitizing circuit 300 under the amplifying mode. Under the amplifying mode, the control circuit 320 has a second configuration that the first switch SW1 and the third switch SW3 are switched on while the second switch SW2 and the fourth switch SW4 are switched off, such that the sensed signal (i.e., the first input signal $S_{in}$) is fed into the amplifying/digitizing circuit 300 via the first capacitor C1. In this way, the generated signal at the output end 314 of the amplifier 310 has a voltage level equal to $$\frac{C1}{C2}S_{in},$$

where 'C1' represents the capacitive value of the first capacitor C1, 'C2' represents the capacitive value of the second capacitor C2, and '$S_{in}$' represents the voltage level of the first input signal $S_{in}$. That is, the SNR of the processed signal of the CIS system is greatly improved by selecting the capacitive values of the first capacitor C1 and the second capacitor C2.

Figure 6:
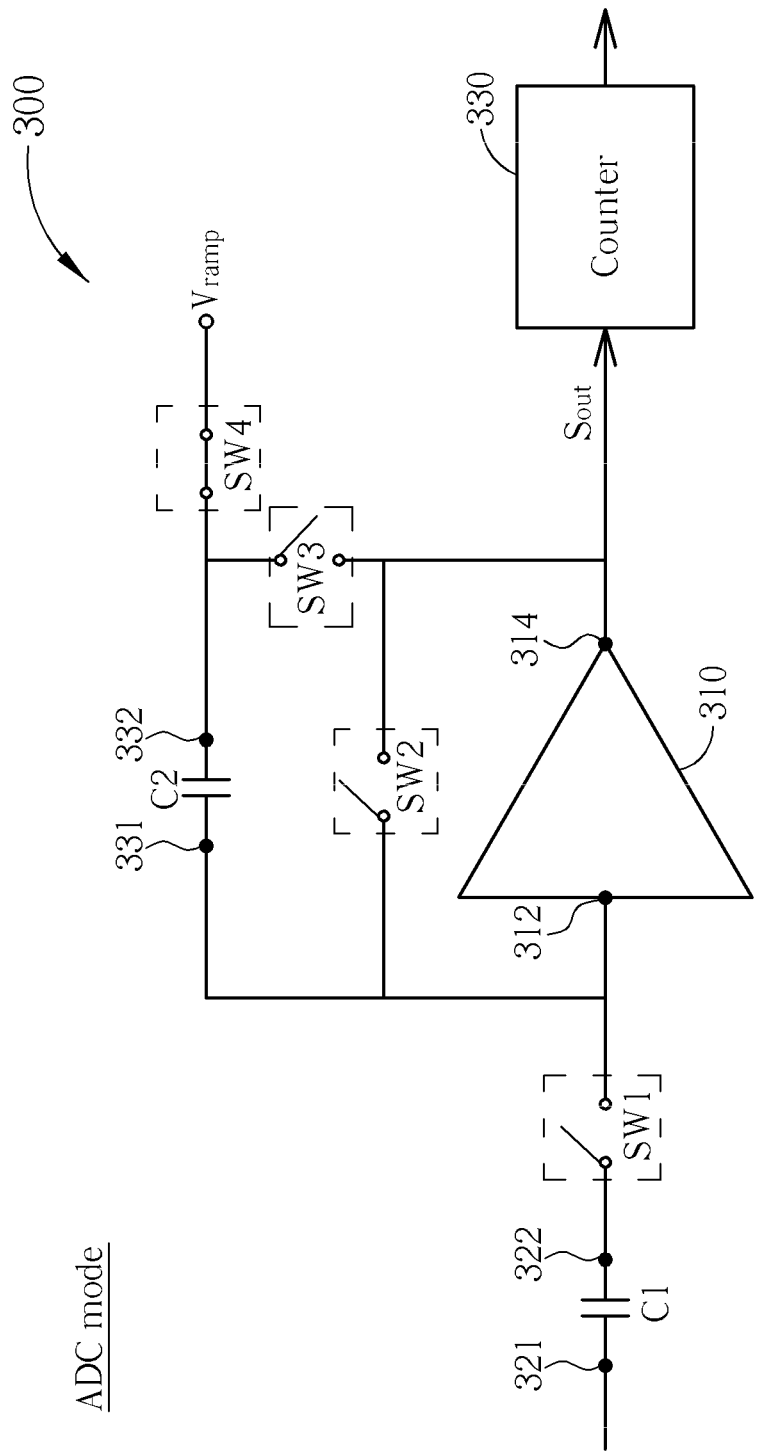
FIG. 6 is a diagram illustrating an exemplary embodiment of the configuration of the amplifying/digitizing circuit under the ADC mode.

Please refer to FIG. 6 in conjunction with FIG. 2-5. FIG. 6 is a diagram illustrating an exemplary embodiment of the configuration of the amplifying/digitizing circuit 300 under the ADC mode. In one implementation, the amplifying/digitizing circuit 300 is integrated in a ramp ADC which includes a ramp voltage source (i.e., the second input signal $V_{ramp}$) coupled to the fourth switch SW4. Under the ADC mode, the ramp voltage is a time-variant signal, and when the time-variant ramp signal $V_{ramp}$ reaches a voltage level $$\frac{C1}{C2} \text{Sin}$$

derived under the former amplifying mode, the amplifier 310 will make the comparison result $S_{out}$ have a transition from a first logic level (e.g., '1') to a second logic level (e.g., '0').

Figure 7:
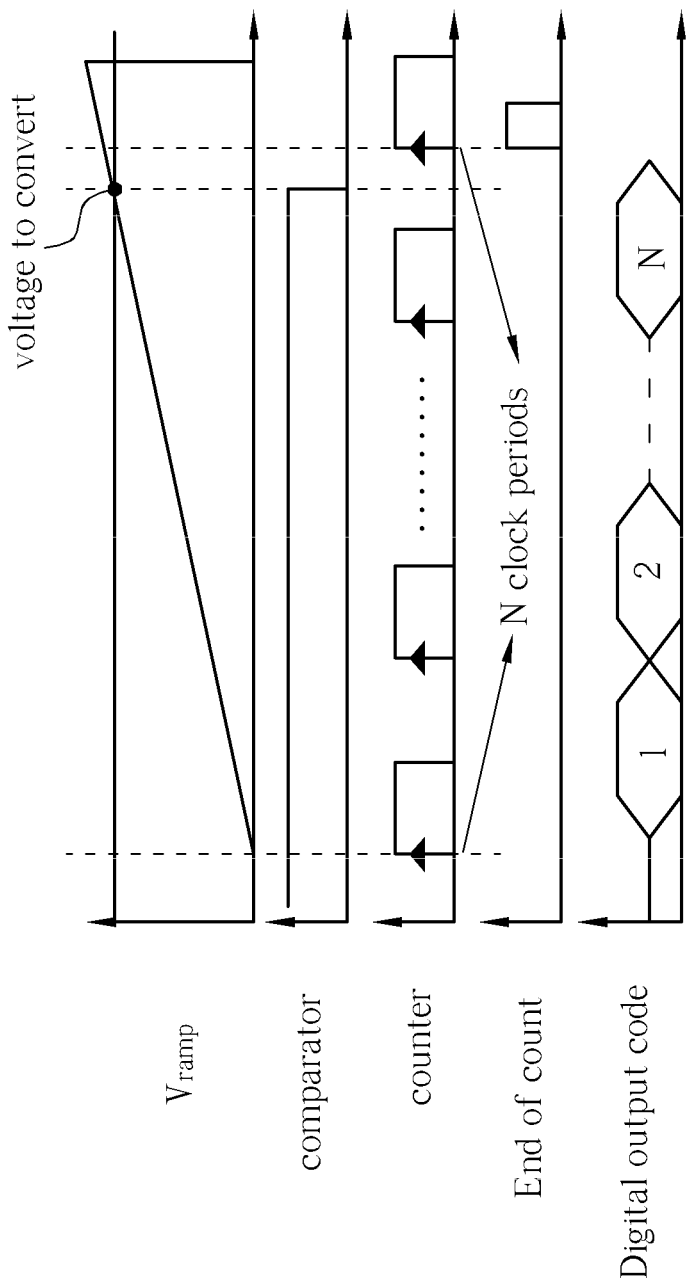
FIG. 7 is a timing diagram illustrating operations of a ramp ADC which employs the exemplary amplifying/digitizing circuit of the present invention.

For an example of this, please refer to FIG. 7 in conjunction with FIGS. 2~6. FIG. 7 is a timing diagram illustrating operations of a ramp ADC which employs the exemplary amplifying/digitizing circuit of the present invention. As shown in FIG. 7, the ramp voltage $V_{ramp}$ increases according to operations of a counter. When the ramp voltage $V_{ramp}$ reaches the voltage level $$\frac{C1}{C2} Si_n$$

generated in the amplifying mode, the amplifier 310 acting as a comparator will have a transition from the first logic level (e.g., '1') to the second logic level (e.g., '0') due to characteristics of the circuit architecture proposed in the embodiment of the present invention. Please note that the magnitude of the first logic level and the second logic level is not meant to be a limitation of the present invention. When the comparison result at the output end 314 of the amplifier 310 changes, the counter 330 outputs the ADC output code. Since the operations and details of the ramp ADC are well known to people skilled in this art, further descriptions are omitted here for the sake of brevity.

Figure 8:
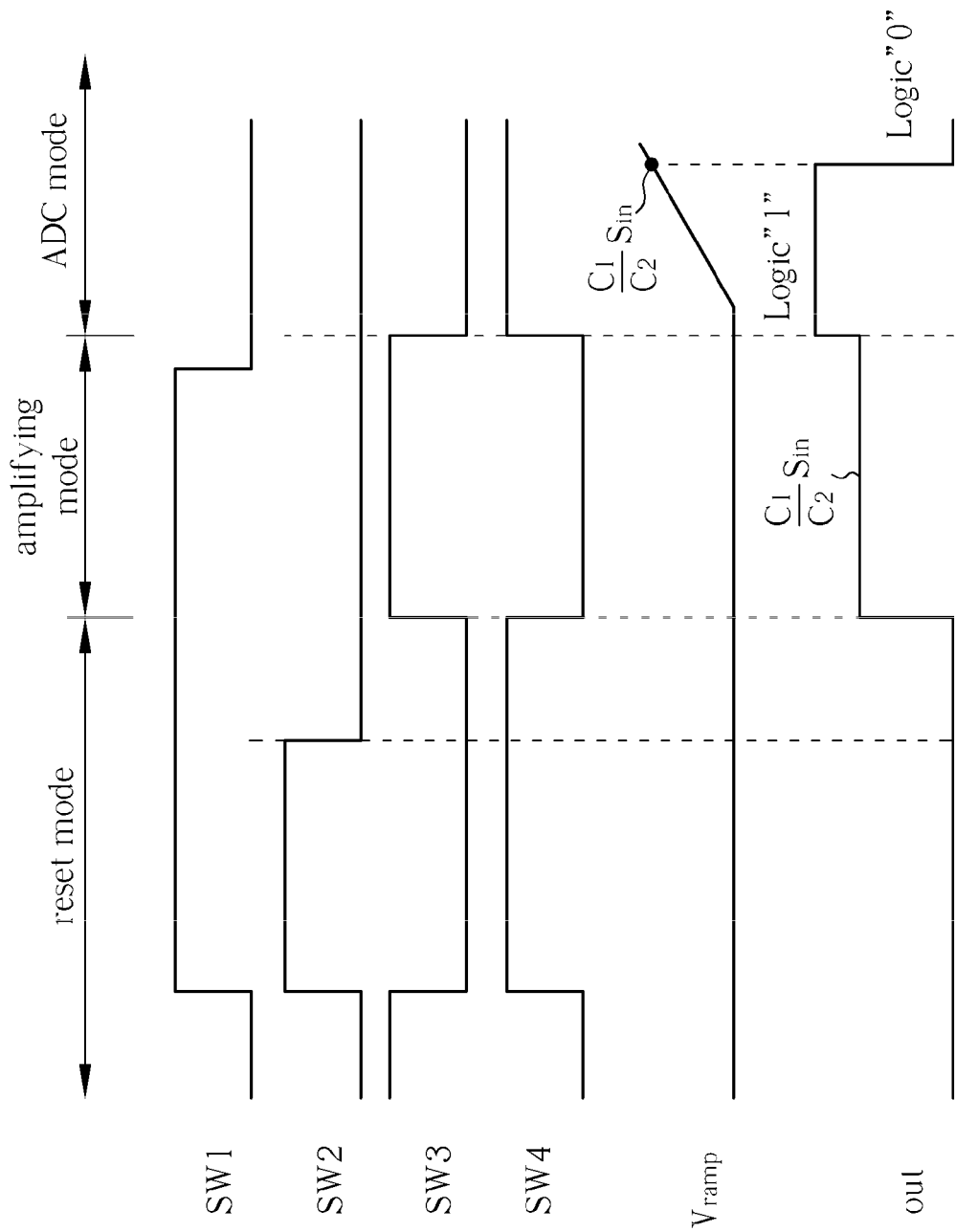
FIG. 8 is a timing diagram illustrating operations of the amplifying/digitizing circuit under the reset mode, the amplifying mode, and the ADC mode.

Please refer to FIG. 8 in conjunction with FIGS. 2~7. FIG. 8 is a timing diagram illustrating operations of the amplifying/digitizing circuit 300 under the reset mode, the amplifying mode, and the ADC mode. In the reset mode, the first switch SW1, the second SW2 and the fourth SW4 are switched on, where the second switch SW2 is turned off slightly early than the third switch SW3 does. In the amplifying mode, the fourth switch SW4 is turned off and the third switch SW3 is turned on, while the first switch SW1 remains on and the second switch SW2 is turned off. Moreover, under the amplifying mode, the output signal at the output end 314 of the operational amplifier 310 is $$\frac{C1}{C2} S_{in}$$

when the sensed signal received at the first node 321 is $S_{in}$. Under the ADC mode, the ramp voltage $V_{ramp}$ increases when the counter keeps counting, until the ramp voltage $V_{ramp}$ reaches the voltage level of the amplified signal $$\frac{C1}{C2} S_{in}$$

derived under the amplifying mode. In this exemplary embodiment, the output end 314 of the amplifier 310 outputs logic "1" when the ramp voltage $V_{ramp}$ is lower than the voltage level of the amplified signal $$\frac{C1}{C2} S_{in},$$

and the comparison result changes to logic level "0" when the ramp voltage $V_{ramp}$ reaches $$\frac{C1}{C2} S_{in}.$$

In conclusion, the present invention provides an amplifying/digitizing circuit which can be switched under at least an amplifying mode and an ADC mode, to amplify a received signal before a comparison operation is performed, and an image sensor system adopts the amplifying/digitizing circuit therein. In one implementation, the disclosed amplifying/digitizing circuit is applied to a ramp ADC; however, a person skilled in the art would readily appreciate that the disclosed amplifying/digitizing circuit can also be applied to other ADC architectures when there is a need to perform the amplification and comparison through use of a single operational amplifier. Furthermore, no matter whether the aforementioned amplification and/or comparison functionalities are realized, any application employing the exemplary the proposed amplifying/digitizing circuit still falls within the scope of the present invention. The image sensor system adopts an amplifying/digitizing circuit with both an amplifying function and a digitalizing function via a signal amplifier obeys and falls within the scope of the present invention.

Those skilled in the art will readily observe that numerous modifications and alterations of the device and method may be made while retaining the teachings of the invention.

What is claimed is:

1. An amplifying/digitalizing circuit, comprising:
   an amplifier, having an input end and an output end; and
   a control circuit, coupled to the input end of the amplifier and directly connected to the output end of the amplifier, wherein when the amplifying/digitalizing circuit is operated under an amplifying mode, the control circuit has a first configuration to receive a first input signal and makes the amplifier generate an output voltage at the output end according to the first input signal and an amplification factor; and when the amplifying/digitizing circuit is operated under an ADC mode, the control circuit has a second configuration to receive a second input signal and makes the amplifier generate a comparison result according to the second input signal and the output voltage;
   wherein when the amplifying/digitalizing circuit is operated under a reset mode, the control circuit has a third configuration to reset the amplifier, and the control circuit comprises:
   a first capacitor, having:
      a first node, coupled to the first input signal; and
      a second node, coupled to the input end of the amplifier;

a second capacitor, having:
   a first node, coupled to the input end of the amplifier; and
   a second node;
a first switch, coupled between the second node of the first capacitor and the input end of the amplifier;
a second switch, coupled between the input end of the amplifier and the output end of the amplifier;
a third switch, coupled between the output end of the amplifier and the second node of the second capacitor; and
a fourth switch, coupled between the second node of the second capacitor and the second input signal;
wherein the first and third switches are switched on and the second and fourth switches are switched off under the amplifying mode; the fourth switch is switched on and the first, second and third switches are switched off under the ADC mode; and the first, second, and fourth switches are switched on and the third switch is switched off under the reset mode.

2. The amplifying/digitalizing circuit of claim 1, wherein the amplification factor depends on a capacitive ratio of the first capacitor to the second capacitor.

3. The amplifying/digitalizing circuit of claim 1, wherein the second input signal is a time-variant ramp signal; and when the time-variant ramp signal reaches the output voltage, the amplifier makes the comparison result have a transition from a first logic level to a second logic level.

4. The amplifying/digitizing circuit of claim 1, wherein the amplifying/digitizing circuit enters the reset mode, the amplifying mode, and the ADC mode sequentially.

5. The amplifying/digitalizing circuit of claim 1, wherein the amplifier is a single-ended amplifier.

6. The amplifying/digitalizing circuit of claim 1, being implemented in a ramp analog-to-digital converter (ADC).

7. An amplifying/digitizing circuit, comprising:
an amplifier, having an input end and an output end; and
a control circuit, coupled to the input end and the output end of the amplifier;
wherein the control circuit comprises:
   a first capacitor, having:
      a first node, coupled to the first input signal; and
      a second node, coupled to the input end of the amplifier;
   a second capacitor, having:
      a first node, coupled to the input end of the amplifier; and
      a second node;
   a first switch, coupled between the second node of the first capacitor and the input end of the amplifier;
   a second switch, coupled between the input end of the amplifier and the output end of the amplifier;
   a third switch, coupled between the output end of the amplifier and the second node of the second capacitor; and
   a fourth switch, coupled between the second node of the second capacitor and the second input signal;
   wherein when the amplifying/digitalizing circuit is operated under a reset mode, the control circuit has a third configuration to reset the amplifier; the first and third switches are switched on and the second and fourth switches are switched off under the amplifying mode; the fourth switch is switched on and the first, second and third switches are switched off under the ADC mode; and the first, second, and fourth switches are switched on and the third switch is switched off under the reset mode.

8. The amplifying/digitizing circuit of claim 7, wherein the amplifier is a single-ended amplifier.

9. The amplifying/digitizing circuit of claim 7, being implemented in a ramp analog-to-digital converter (ADC).

10. An image sensor system comprising:
a sensor array, for sensing photons to output an electrical signal; and
an amplifying/digitizing circuit, for amplifying and digitalizing the electrical signal to output a digital signal, the amplifying/digitalizing circuit comprising:
   an amplifier, having an input end and an output end; and
   a control circuit, coupled to the input end and the output end of the amplifier;
   wherein the control circuit comprises:
      a first capacitor, having a first node and a second node, the second node being connected to the input end of the amplifier;
      a second capacitor, having a first node and a second node, the first node of the second capacitor being connected to the input end of the operation amplifier;
      a first switch, for selectively connecting the electrical signal from the sensor array to the input end of the amplifier;
      a second switch, connecting the second node of the second capacitor selectively to the output end of the amplifier or a ramp voltage;
      a third switch, coupled between the output end of the amplifier and the second node of the second capacitor; and
      a fourth switch, coupled between the second node of the second capacitor and the second input signal;
      wherein when the amplifying/digitalizing circuit is operated under a reset mode, the control circuit has a third configuration to reset the amplifier; the first and third switches are switched on and the second and fourth switches are switched off under the amplifying mode; the fourth switch is switched on and the first, second and third switches are switched off under the ADC mode; and the first, second, and fourth switches are switched on and the third switch is switched off under the reset mode.

11. The image sensor system of claim 10, wherein under an amplifying mode, the first switch connects the electrical signal to the input end of the amplifier, and the second switch connects the second end of the second capacitor to the output end of the amplifier, such that the amplifier outputs an amplified signal.

12. The image sensor system of claim 10, wherein under an ADC mode, the first switch disconnects the electrical signal from the input end of the amplifier, and the second switch connects the second node of the second capacitor to the ramp voltage.

13. The image sensor system of claim 12, wherein the amplifying/digitalizing circuit further comprises a counter; and under the ADC mode, the ramp voltage keeps increasing, and when the ramp voltage substantially reaches the voltage value of the amplified signal, the amplifier outputs a logic signal; wherein the counter outputs the digital signal according to the logic signal.

14. The image sensor system of claim 10, wherein the amplifying/digitalizing circuit further comprises a third switch, coupled between the input end and output end of the amplifier, disconnected under the amplifying mode and the ADC mode, and connected under a reset mode for reset the amplifier.

15. The image sensor system of claim 10, wherein the amplifier is a single-ended amplifier.

\* \* \* \* \*